United States Patent [19]

Val

[11] Patent Number: 4,755,910

[45] Date of Patent: Jul. 5, 1988

[54] HOUSING FOR ENCAPSULATING AN ELECTRONIC CIRCUIT

[75] Inventor: Christian Val, Saint Remy Les Chevreuses, France

[73] Assignee: Cimsa Sintra, Asnieres, France

[21] Appl. No.: 942,655

[22] Filed: Dec. 17, 1986

[30] Foreign Application Priority Data

Dec. 17, 1985 [FR] France .............................. 85 18695

[51] Int. Cl.⁴ ............................................. H05K 7/06
[52] U.S. Cl. .................................. 361/401; 361/388; 361/395; 357/74; 439/70
[58] Field of Search .................. 339/17 CF; 361/321, 361/321 C, 386, 388, 395, 399, 400, 401, 403, 412, 413, 414; 357/68, 71, 74, 80, 81; 174/52 FP; 439/55, 68, 70, 69, 76

[56] References Cited

U.S. PATENT DOCUMENTS

| | | | |
|---|---|---|---|
| 4,288,841 | 9/1981 | Gogal | 361/401 |
| 4,320,438 | 3/1982 | Ibrahim | 361/401 |
| 4,408,256 | 10/1983 | Val | 361/403 |
| 4,413,170 | 11/1983 | Val et al. | 219/316 |
| 4,518,818 | 5/1985 | Le Ny et al. | 174/52 FP |
| 4,546,028 | 11/1985 | Val | 428/116 |
| 4,553,020 | 11/1985 | Val | 219/209 |
| 4,559,579 | 12/1985 | Val | 361/220 |
| 4,563,725 | 1/1986 | Kirby | 361/388 |
| 4,578,697 | 3/1986 | Takemac | 357/74 |
| 4,614,194 | 9/1986 | Jones | 361/401 |
| 4,628,407 | 12/1986 | August | 361/388 |
| 4,639,826 | 1/1987 | Val et al. | 361/272 |
| 4,651,192 | 3/1987 | Matsushita | 357/74 |
| 4,654,694 | 3/1987 | Val | 357/74 |

FOREIGN PATENT DOCUMENTS

| | | |
|---|---|---|
| 42987 | 1/1982 | European Pat. Off. . |
| 154998 | 9/1985 | European Pat. Off. . |
| 2555812 | 5/1985 | France . |
| 2565032 | 11/1985 | France . |

OTHER PUBLICATIONS

Val, "Trends in Packaging," 8249 International Journal for Hybrid Microelectronics, vol. 7, No. 2, Jun. 1984, pp 21–34.

Miersch, "High-Speed Metal Carrier Packaging System Using Thin–film Interconnection Techniques," IBM Technical Disclosure Bulletin, vol. 23, No. 1, Jun. 1980, pp 374–377.

Martin, "Hermetic Hybrid Module," IBM Technical Disclosure Bulletin, vol. 21, No. 10, Mar. 1979, pp 4023–4024.

Primary Examiner—G. P. Tolin
Attorney, Agent, or Firm—Pollock, VandeSande & Priddy

[57] ABSTRACT

A housing more particularly intended for encapsulating a wafer scale electronic circuit, realized in hybrid technology or integrated on semi-conducting substrate. In this housing:

supply voltages are brought to different points disposed over the surface of the circuit lead-in circuits are constituted by conducting planes, placed in superimposed layers in the cover or the base of the housing.

10 Claims, 6 Drawing Sheets

FIG_1-a

FIG_1-b

FIG_2

FIG_3

FIG_4

FIG_7-a

FIG_7-b

FIG_9-a

FIG_9-b

HOUSING FOR ENCAPSULATING AN ELECTRONIC CIRCUIT

BACKGROUND OF THE INVENTION

1. Field of the Invention

The present invention relates to a housing for encapsulating an electronic circuit, more particularly intended for a large-size electronic circuit, realized in hybrid technology or integrated on a semi-conducting substrate.

2. Summary of the Prior Art

When the size of an electronic circuit is increased, the length of the current-conducting path in the semi-conductor, in the case for example of an integrated electronic circuit, is likewise increased. This increase has various prejudicial effects:

The electric resistance increases with the length of the current path, thereby raising on the ohmic losses. Once a certain length has been exceeded, the supply voltage becomes too small for normal operation of the integrated circuit.

The inductance also increases with the current path length, thereby generating delays in the signals that are a function of the current path length of these signals. When certain of the current paths become great the delays are no longer negligible compared, for example, with the period of a clock in a digital circuit.

The increase in inductance also generates interfering voltages according to the formula $V = L \cdot di/dt$. These interference voltages can become, in certain cases, equal to or higher than the immunity to circuit noises, i.e. the difference between the threshold and the logic "0" or "1".

In order to reduce these effects, one solution supplies the integrated circuit at numerous points disposed over its entire surface, and not only on its periphery. However, in order for this solution to be effective, it is necessary that the current lead-in circuits have both a resistance and an inductance lower than those of the semi-conductor, in order not to present the drawbacks inherent in prior solutions. This condition cannot be met in the case where these connections are classically realized by wires over a great length.

When the electronic circuit is realized in hybrid technology, the same types of difficulties appear when the circuit becomes large-dimensioned.

These factors thus constitute a limitation to the dimensions of an electronic circuit.

SUMMARY OF THE PRESENT INVENTION

An object of the present invention is to reduce these limitations, first by minimizing the current path of the supply voltages in the electronic circuit itself, and second by using as supply voltage lead-in paths, conductive planes placed in superimposed layers in the cover or the base of the housing encapsulating the electronic circuit. Minimizing current path of the supply voltage is effected by bringing in the supply voltage at different points disposed over the surface of the circuit through openings provided in the circuit.

BRIEF DESCRIPTION OF THE DRAWINGS

Other objects, features and advantages of the invention will become apparent from reading the following description, given by way of non-limitative illustration with reference to the appended drawings in which.

On these different figures, the same references designate the same elements. Furthermore, for enhanced simplicity of the drawings, the true scale has not been respected.

DETAILED DESCRIPTION OF THE DRAWINGS

Figure 1A:
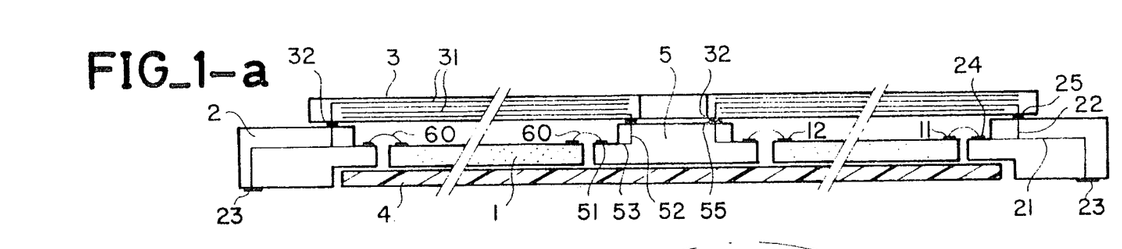
FIGS. 1a and 1b represent a first embodiment of the housing according to the invention for the encapsulation of an integrated circuit, respectively in a cross-sectional view and viewed from above.
Figure 1B:
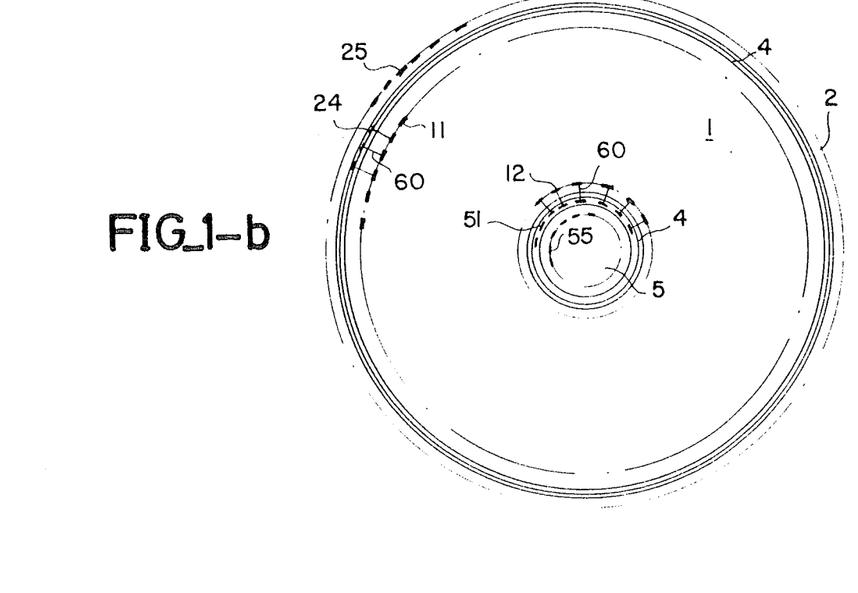

FIGS. 1a and 1b represent a first embodiment of the housing according to the invention, seen in cross-section on FIG. 1a and viewed from above on FIG. 1b.

The housing according to the invention is thus intended for encapsulating a large-size electronic circuit. In FIGS. 1a and 1b, this electronic circuit is for example a wafer made of semi-conducting material in which is produced an electronic circuit. This wafer can typically have a size of about several centimeters, for example from 1 to 10 cm. In the embodiment represented in FIGS. 1a and 1b, a central opening is provided in the wafer. Contact studs of the circuit, reference 11, are disposed over the periphery of the wafer 1. Other contact studs referenced 12, are disposed over the periphery of the central opening.

The housing according to the invention for encapsulating this wafer 1 comprises, in this embodiment, a bottom 4, a peripheral part 2 in the shape of a ring forming with the bottom 4 a base, a central pillar or strut 5 and a cover 3. The pillar 5 is placed on the bottom 4 and at the center of the bottom 4. The semi-conducting wafer 1 is placed on the bottom 4 so that the pillar 5 projects from a central opening of the wafer 1. The ring 2 is placed at the periphery of the bottom 4. The cover 3 which comprises a central opening with a smaller diameter than the pillar 5, rests both on the peripheral ring 2 and the pillar 5.

By way of example, the ring 2, the pillar 5 and the cover 3 can be made of alumina. The bottom 4 can also be made of alumina or metal or also of a composite material, presenting good thermal conduction properties in order to facilitate cooling of the wafer 1. When the three elements 2, 4 and 5 are made of alumina, the pillar 5 and the ring 2 are preferably fritted on the bottom 4. When the bottom 4 is metallic, the elements 2 and 5 are preferably brazed on the bottom 4, by means for example of a silver-copper brazing.

The semi-conducting wafer 1 is classically secured on the bottom 4. The wafer 1 is connected, by its contact studs 12 and connecting wires 60 to a first connecting level of the pillar 5, bearing studs 51. The wafer 1 is furthermore connected (by studs 11) to a first connection level of the peripheral ring 2, bearing studs 24. These studs 24 of the ring 2 are connected, by tracks 21 and metallized holes 22 conventionally formed, to contact studs 23 for connection to the outside. The studs 24 are also connected to the studs 25 situated on a second connection level of the ring 2 and intended to transmit to the cover 3 the supply voltages received on the studs 23.

In this embodiment, the cover 3 fulfills the supplementary function of the invention of distributing the supply voltages to the center of the semi-conducting wafer 1, through the pillar 5. For this purpose, the cover 3 comprises a plurality of conducting parallel planes 31, insulated one from the other, each bringing a supply voltage or ground towards the central pillar 5. The cover 3 comprises on its lower face contact studs 32 that enter into contact with studs 25 of the ring 2 and the studs 55 of the pillar 5, located on a second connection level. The studs 55 of the pillar 5 are connected to the studs 51 of this same pillar, classically by means of metallized holes and tracks 53.

Therefore, according to the invention, the supply voltages received by the housing through the studs 23 are supplied to the electronic circuit made in the wafer 1, on the one hand by the peripheral studs 11 of the wafer 1, and on the other hand, by the central studs of wafer 1. In this manner, the distance travelled in the semi-conducting wafer by the supply voltages is at most a semi-radius (while ignoring the dimension of the central opening of the wafer which may be considered as insignificant) instead of being an entire radius which is the case if the circuit were only supplied peripherally.

Signals, other than supply voltages, are preferably connected to the peripheral studs 11 of the wafer.

Furthermore, in order to reduce the resistance and the impedance of the travel of the supply voltages, said voltages are guided by conducting planes. In fact, with respect to the resistance of the connections, it is known that resistance is inversely proportional to the section of the conductor forming the connection. If this section is rectangular, and if one of the dimensions is given (thickness of the conductor, for example) it can be seen that this resistance is that much lower as the conductor is larger. This means that one plane, as used in the present invention, presents a resistance smaller than a filamentary conductor or conducting track, with given thickness and material. Furthermore, the material constituting the conducting planes is chosen from among those that present a low resistivity.

With respect to the impedance presented by the connections, it appears that the impedance of a sheet is lower than that of a wire, or a given circuit path length and material. For one wire:

$$L_f = 2 \cdot l [\text{Log}(4l/d) - \tfrac{3}{4}]$$

where:
$L_f$ is the inductance of the wire in nH;
l is the length of the wire in cm;
d is the diameter of the wire in cm;
Log is the symbol of the neperian logarithms.
For l=1 cm and d=50 μm, $L_f$=11.87 nH.
For a sheet, the expression of its inductance $L_p$ is:

$$L_p = 2 \cdot L [\text{Log}(2 \cdot L/l) + 0.5]$$

where L and l are respectively the width and the length of the sheet in cm. For L=l=1 cm, is obtained $L_p$=2.386 nH, which is a value much lower than the value of $L_f$.

It is to be noted furthermore that a single supply voltage can be guided by several planes such as 31. This allows the limitation effects on the technological level to be overcome upon increase of the thickness of the planes.

Conducting planes 31 in the cover 3 form furthermore capacitors that can advantageously fulfill the functions usually carried out by auxiliary capacitances disposed around a housing or even on the housing, as the decoupling function for example.

In the housing according to the invention, the central pillar 5 also fulfills another function, that of mechanical support of the cover 3. In fact, when the dimensions of the housing become large, there are strong forces which act on the cover during sealing of the housing and during the operation of the device (pressure decompression cycles due to the differences of temperature and altitude). These forces on the cover raise problems of mechanical resistance of the cover, which are overcome by the existence of the central pillar, without considerably increasing its thickness.

Finally, the materials constituting the conducting planes 31 and the cover 3 can be chosen in order to protect ("harden") the housing from irradiations, for example according to the technique described in French Pat. No. 2 547 113.

Figure 2:
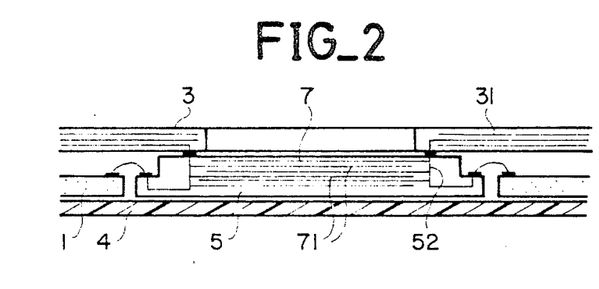
FIG. 2 represents a variant embodiment of one part of the housing of the previous drawing, comprising a capacitor.

FIG. 2 represents a variant embodiment of the previous figure, in which the central pillar 5 further includes a capacitance.

FIG. 2 is a partial view similar to FIG. 1a, in which can be seen the pillar 5 and, partially, the bottom 4, the semi-conducting wafer 1 and the cover 3 with its conducting planes 31.

In this variant, the central pillar 5 further includes a capacitance, formed by a plurality of conducting, parallel planes 71 and insulated one from another, forming the armatures of the capacitances and connected for example between the metallized holes 52, the material constituting the pillar 5 forming the dielectric of the capacitance.

Figure 3:
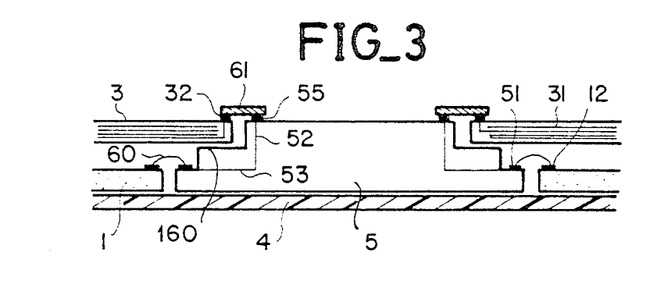
FIG. 3 represents a connecting variant of the supply voltage lead-in paths to the electronic circuit, when they are brought by the cover of the housing.

FIG. 3 represents another variant of the device of FIG. 1a, illustrating the mode of connection of the cover 3 to the central pillar 5.

FIG. 3 shows partially the semi-conducting wafer 1, the bottom 4 and the cover 3, disposed around the pillar 5.

However, the pillar 5 no longer comprises two levels (FIG. 1a) but now includes three levels. The first level still bears the contact studs 51 connected to the wafer 1. The contact studs 55 intended to be connected to the cover 3 are now supported by a third upper level. The cover 3 is mechanically supported by a second intermediary level 160 of the pillar 5. The contact studs 32 of the cover 3 are now borne by its upper face and the connection between the studs 32 and the studs 55 is ensured by means for example of strips 61 or wires.

Of course, this connecting method also applies to the connection of the cover 3 with the peripheral ring 2 of the FIG. 1a.

The advantages of this variant are to allow the housing to be essentially flat, thereby facilitating its carrying out, and to separate the sealing of the cover operation on the pillar 5 and the ring 2 from that of the electrical connection of the studs 32 with the studs 55 and 25, thereby facilitating carrying out the invention. In fact, in the embodiment illustrated in FIGS. 1a and 1b, sealing and connecting must be simultaneously carried out.

Figure 4:
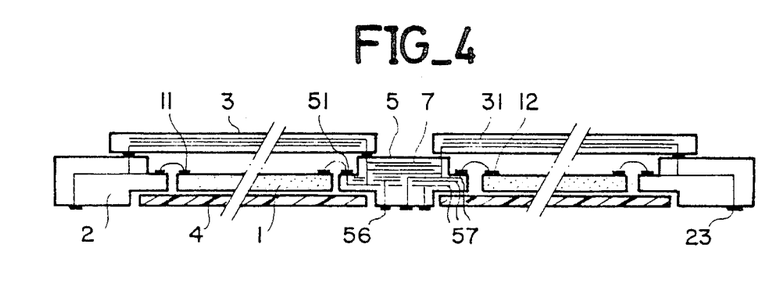
FIG. 4 represents a second embodiment of the housing according to the invention.

FIG. 4 represents another embodiment of the device according to the invention in which the power is supplied to the housing by the central pillar.

This figure shows the central pillar 5 of the peripheral ring 2, the bottom 4, the cover 3 and the semi-conducting wafer 1.

As before, the ring 2 is provided with studs 23 for connecting the housing towards the outside and it is connected to the studs 11 of the semi-conducting wafer. However, in this embodiment, the bottom 4 comprises a central opening so as to allow a bottom of the pillar 5 to appear which is thus provided in its lower face with contact studs 56 for connecting the housing to the outside. These studs 56 received in particular power voltages for wafer 1. They are electrically connected to the studs of the wafer 1 through the intermediary of conducting planes 57, placed parallelly on one another in the thickness of the pillar 5. The cover is secured to the upper face of the ring 2 and of the pillar 5 and connected to the latter as illustrated for example on FIG. 1a or 1b. The conducting planes 31 of the cover 3 ensure the arrival of power to the studs 11 of the semi-conducting wafer 1. The bottom 4 is mechanically secured, without electrical connection, for example, onto a shoulder provided in the pillar 5 and the ring 2.

In the variant represented in FIG. 4, the pillar 5 comprises furthermore a capacitance 7 realized in the upper portion of the pillar and analogous to the capacitance 7 of FIG. 2. The planes 57 are thus localized in the lower portion of the pillar 5.

It is to be noted that the studs 56, like the other studs 23 for connecting the housing to the outside, can be provided with pins for subsequent connection onto a bearer substrate of the printed circuit type.

In another embodiment (not illustrated) the supply voltage lead-in circuits are constituted by conducting planes disposed parallelly with respect to one another in the thickness of the bottom 4 of the housing, in a manner analogous to that illustrated in the preceding figures for the planes 31 of the cover 3.

Figure 5A:
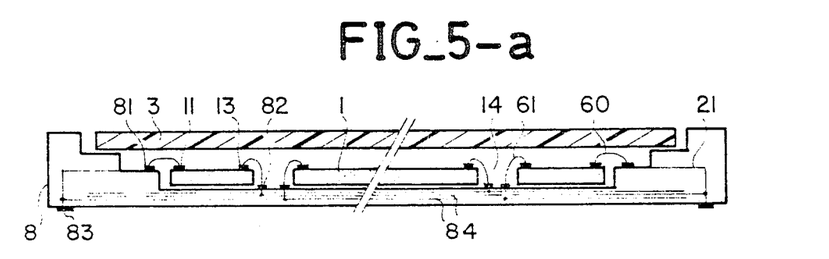
FIGS. 5a and 5b represent a third embodiment of the housing according to the invention, respectively in cross-section and viewed from above.
Figure 5B:
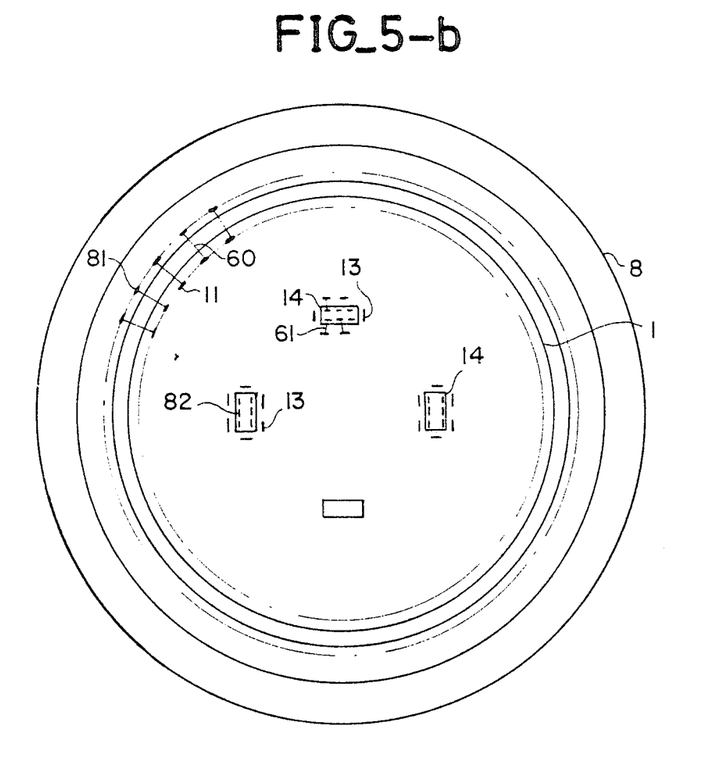

FIGS. 5a and 5b represent another embodiment of the device according to the invention, FIG. 5a seen in cross-section and FIG. 5b viewed from above. In this embodiment, the semi-conducting wafer is no longer provided with a single opening in its center but with a plurality of openings, disposed over its surface.

In FIGS. 5a and 5b the wafer 1 is provided with openings 14 which are, in this example, substantially rectangular and disposed substantially on a single radius of circle close to half that of the wafer 1. The peripheral ring 2 of the housing and its bottom 4 are joined in a single element 8 forming the base of the housing, the cover 3 being secured to a shoulder provided in the base 8. The wafer 1 is disposed in the bottom of the base 8 by any known means. A second shoulder of the base 8 bears wafer contact 81 and constitutes a first connection level between the studs 11 disposed at the periphery of the wafer 1 and the base 8, connection achieved by wires 60. On the upper face of the bottom of the base is disposed wafer contact 82, intended to be connected by wire 61 to wafer contact 13, disposed on the wafer 1 around the openings 14.

According to the invention, the base 8 comprises a plurality of parallel, conducting planes 84, insulated one from another, disposed in the bottom of the base and connected to the studs 82 and on the other hand to the external contact studs of the housing, referenced 83 and disposed on the lower face of the base 8.

Figure 6A:
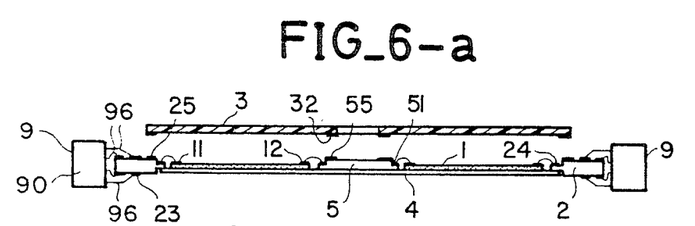
FIGS. 6a and 6b represent an embodiment of the connection of the housing according to the invention, respectively in cross-section and viewed from above.
Figure 6B:
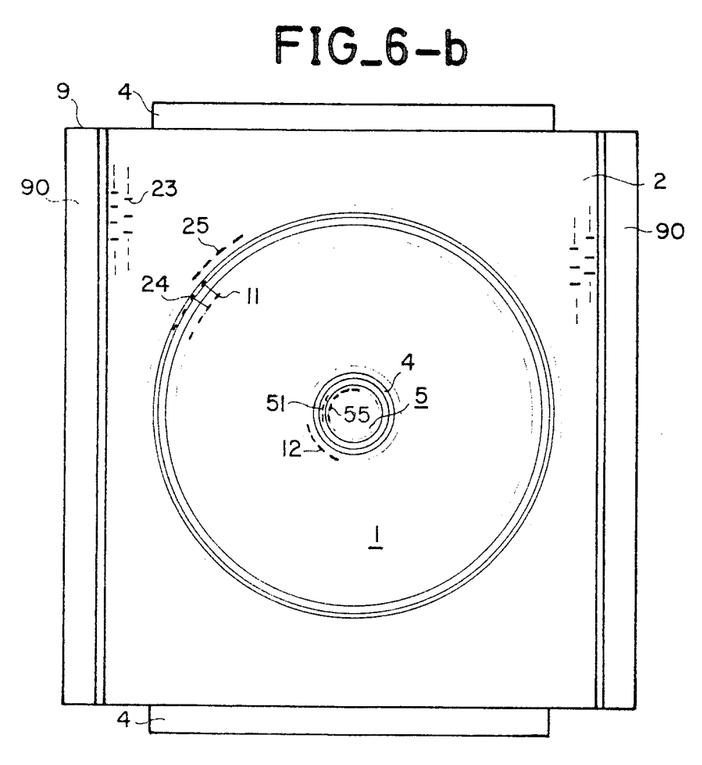

FIGS. 6a and 6b represent an embodiment of the connection outside of the housing according to the invention in the case where this latter is, by way of example, realized such as described in FIG. 1a or 1b. FIG. 6a shows a cross-section view and FIG. 6b a view from above of this same device.

For enhanced clarity, the cover has been illustrated on FIG. 6a as distant from the assembly formed by the wafer 1 and the other elements.

The contact studs 23 borne by the ring 2, for example borne by both the upper and lower faces of the ring, are here clamped into two U-type connectors of which the contacts 96 inserted in a unit 90 have been represented in FIG. 6a; in FIG. 6b, only unit 90 has been represented, i.e. the contacts 96 are omitted.

Furthermore, the device is produced in such a way that the bottom 4 of the housing, when it acts as thermal drain, extends beyond the housing on the sides where connectors 9 have not been provided, as represented in FIG. 6b so as to facilitate thermal dissipation.

Figure 7A:
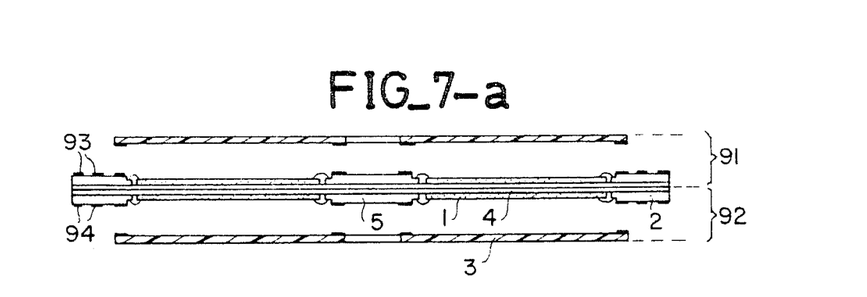
FIGS. 7a and 7b represent two embodiments for producing a housing according to the invention encapsulating two electronic circuits.
Figure 7B:
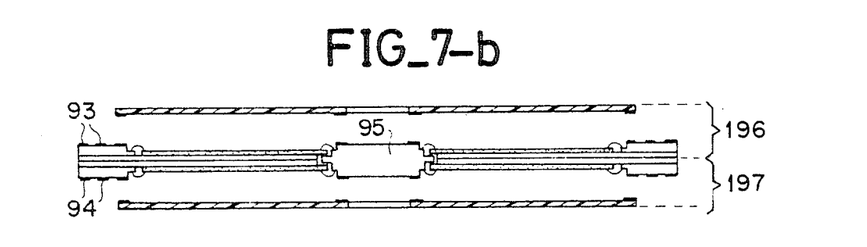

FIGS. 7a and 7b represent two variants of the device according to the invention, each bearing two semi-conducting wafers.

FIG. 7a represents two devices, for example such as described by FIG. 1a, referenced 91 and 92, and placed so that their bottoms 4 are in contact with each other. In this case, the contact studs of each housing towards the outside, referenced successively 93 and 94, are placed on the external face (upper) of them. As in FIG. 6a, the covers have been represented distantly, for enhanced clarity of the drawing.

On FIG. 7b, the two housings concerned, referenced 196 and 197, are of the type shown in FIG. 4, thereby using only a single central pillar 95 for the assembly. Furthermore in this case, the contact studs of each housing towards the outside are placed on the external faces of the housings 96 and 97.

In one variant, not represented, it is possible to utilize a single bottom 4, the wafers being thus disposed on either side of this bottom.

Figure 8A:
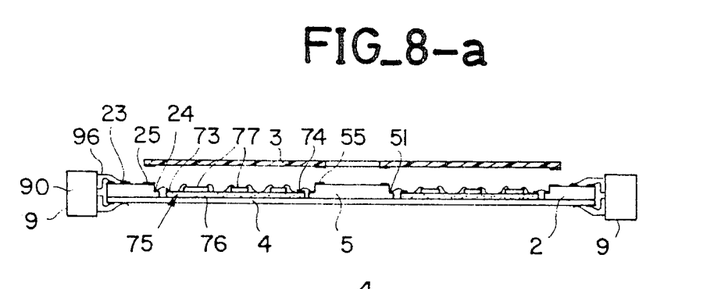
FIGS. 8a and 8b represent an embodiment of the housing according to the invention for encapsulating hybrid circuits, respectively in cross-section and viewed from above.
Figure 8B:
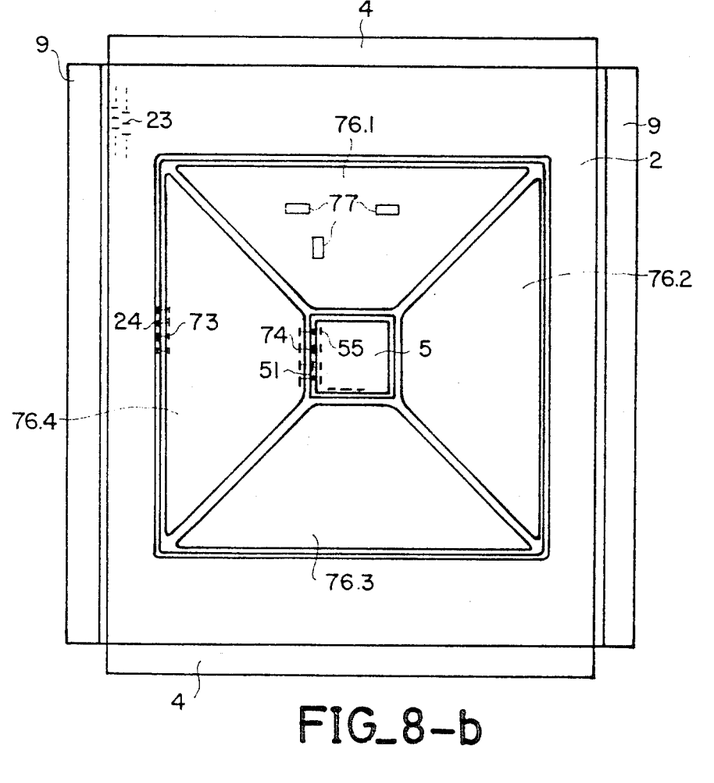

FIGS. 8a and 8b, represent the application of the housing according to the invention to the encapsulation of the hybrid circuit. By way of example, the housing is represented in its embodiment of FIG. 1a or 1b.

FIG. 8a shows the housing according to the invention such as represented in FIG. 1a, i.e. comprising a bottom 4 secured to a peripheral ring 2 and a central pillar 5, the whole being closed by a cover 3. However, the wafer 1 made of semi-conducting material is replaced by a hybrid circuit, globally referenced 75 and comprising components 77, passive or active discrete circuits and integrated circuits, disposed on an insulating substrate 76. The peripheral ring 2 is inserted for example in two U-shaped connectors, analogous to those of FIGS. 6a and 6b.

FIG. 8b represents, seen from above, a variant of realization in which the substrate 76 is divided into a certain number of parts, for example four, referenced 76-1, 76-2, 76-3 and 76-4. By way of example, several components 77 have been schematically represented. By way of further example, the bottom 4 of the housing projects beyond the peripheral ring 2 as illustrated in FIG. 6b, for the same reasons.

The supplies received by the housing on the connectors 9, are transmitted to the hybrid circuit either by peripheral studs, referenced 73, or by central studs referenced 74, via conducting planes disposed, as previously, in the bottom 4 or in the cover 3.

Thus, in this embodiment as in the case of integrated circuits in a silicon wafer the supply of is achieved by conducting planes in a certain number of points disposed over the surface of the hybrid circuit 75 (at the center in the example of FIGS. 8a and 8b, but which can be distributed otherwise, as illustrated in FIGS. 5a and 5b, for example) and not as previously by wire up to the periphery of the substrate of the hybrid circuit then by conducting track disposed on the substrate up to the component to be supplied. The resulting advantages associated to the reduction of the resistance and the inductance, are the same as those for integrated circuits.

Furthermore, the invention brings, in the case of hybrid circuits, certain supplementary advantages, especially:

When the dimensions of the hybrid circuits are increased, the manufacturing efficiency decreases considerably due to the fact that the number of components is increased and these are difficult to test in frequency and in temperature. The housing according to the invention thus allows a large circuit to be divided into several small circuits, as illustrated in FIG. 8b, without complicating the connection, the small circuits thus being borne by a single bottom A considerable difficulty in the manufacture of the hybrid circuits lies in the input-outputs, generally formed by pins, insulated by glass in the case of a metallic housing, and the number of which increases with the size of the circuit. These connections are replaced in the housing according to the invention by contact studs by means of a plugged connector or a flat connector, which considerably simplifies manufacturing.

Figure 9A:
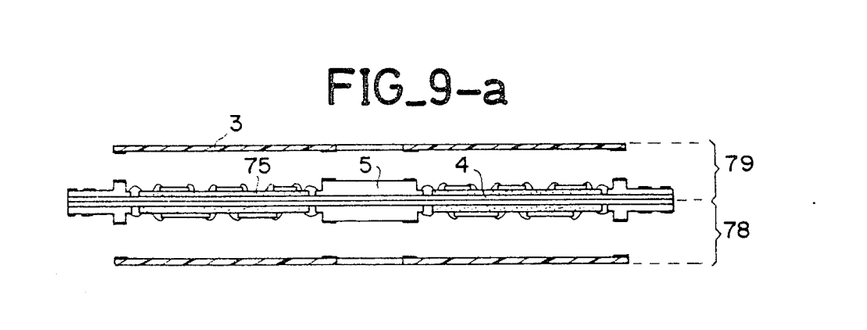
FIGS. 9a and 9b represent two embodiments for producing a housing according to the invention encapsulating two hybrid circuits.
Figure 9B:
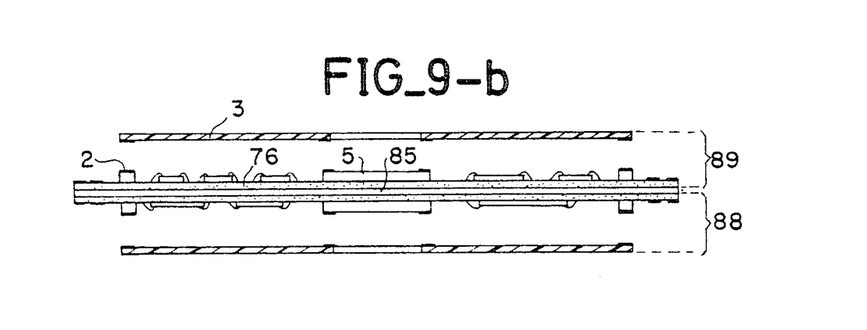

FIGS. 9a and 9b represent two embodiments, seen in cross-section of the encapsulation according to the invention of two hybrid circuits.

FIG. 9a shows two housings, for example such as described in FIG. 8a, referenced respectively 78 and 79, secured to each other by their bottom 8.

FIG. 9b represents another variant, in which the insulating substrate 76 of the hybrid circuit bears both the peripheral ring 2 and the central pillar 5, this comprising as previously a cover 3. In FIG. 9b, two such housings have been disposed, referenced 88 and 89, secured respectively onto each of the faces of a thermal drain referenced 85. The whole forms a solid unit that can be connected electrically to its ends, for example by U-shaped connector such as described on the preceding figure.

The hereinabove description has been given by way of non-limitative example. It is thus to be understood that the different variants are generally cumulative. In this order of ideas, power supply conducting planes can be placed both in the base and the cover of the housing.

What is claimed is:

1. A housing encapsulating an integrated circuit, comprising a base on which is disposed said circuit and a cover mounted over said base and closing the housing, wherein said circuit is provided with a plurality of studs and at least one centrally located opening, said studs divided into two groups, a first group positioned at the periphery of said circuit and a second group positioned at the periphery of said opening, said studs receiving supply voltages for said circuit, said housing comprising means for connecting said supply voltages to said studs of the circuit, said connecting means comprising at least one conducting plane, for each supply voltage positioned in superimposed layers, without electrical contact between one another, within said cover and/or said base.

2. A housing according to claim 1, wherein the planes form a capacitance.

3. A housing according to claim 1, wherein said integrated circuit is a hybrid circuit.

4. A housing according to claim 3, wherein said hybrid circuit is divided into a plurality of parts.

5. A housing according to claim 1, wherein said circuit is provided with a central opening, said housing further comprising a central pillar, secured to said base and passing through said opening of said circuit, said cover resting on said base and said central pillar.

6. A housing according to claim 1, wherein said base includes a bottom, on which is disposed said circuit and an annular structure, secured to the periphery of said bottom and supporting said cover.

7. A housing according to claim 6, wherein said bottom supports said central pillar.

8. A housing according to claim 1, wherein said circuit is provided with a plurality of openings said studs being positioned at the periphery of said circuit and around said openings.

9. A housing according to claim 1, wherein said base further forms a thermal drain.

10. A housing according to claim 1, further comprising a second circuit disposed on another face of said base, said second circuit receiving a second cover, thus encapsulating said second circuit.

* * * * *